United States Patent

Buskirk et al.

Patent Number: 6,010,744
Date of Patent: *Jan. 4, 2000

[54] METHOD FOR NUCLEATION CONTROLLED CHEMICAL VAPOR DEPOSITION OF METAL OXIDE FERROELECTRIC THIN FILMS

[75] Inventors: Peter Van Buskirk, Newtown; Jeff Roeder, Brookfield, both of Conn.; Frank Hintermaier, Munich, Germany; Bryan Hendrix, Danbury; Thomas H. Baum, New Fairfield, both of Conn.

[73] Assignees: Advanced Technology Materials, Inc., Danbury, Conn.; Infineon Technolgies Corporation, Cupertino, Calif.

[*] Notice: This patent is subject to a terminal disclaimer.

[21] Appl. No.: 08/996,574

[22] Filed: Dec. 23, 1997

[51] Int. Cl.$^7$ ........................................ B05D 5/00
[52] U.S. Cl. .................... 427/81; 427/255.31; 427/261; 427/269; 427/309; 427/327; 427/553
[58] Field of Search .................... 427/81, 248.1, 427/307, 309, 327, 553, 255.31, 269, 258, 261

[56] References Cited

U.S. PATENT DOCUMENTS 5,555,486  9/1996  Kingon et al. .................... 361/305
5,789,268  8/1998  Chivukula et al. .................... 437/60
5,817,532  10/1998  Joo et al. .................... 438/3

*Primary Examiner*—Roy V. King
*Attorney, Agent, or Firm*—Oliver A. Zitzmann; Dexter Chin

[57] ABSTRACT

A method is described for the nucleation controlled deposition of ferroelectric thin films by chemical vapor deposition in a novel processing sequence wherein a higher density of bismuth nucleation sites is achieved either by the use of a substrate member which has been treated in a manner to yield a controllably and reproducible rough surface on which SBT films with excellent properties may be produced or by using a chemically modified substrate surface upon which surface chemical properties are modified. Typical techniques for achieving surface roughening include reactive ion etching, inert ion milling and chemical mechanical polishing, each of which may be used to delineate patterned bottom electrodes. The chemical properties of the substrate may be modified by alloy deposition, deposition of seed layers which are then partially or completely in-diffused ion implantation with or without heat treatment and changing the chemistry of the surface by a pre-exposure to chemical agents prior to deposition. The resultant oxide ferroelectric thin films are suitable for use in capacitors, memory devices and the like.

45 Claims, 2 Drawing Sheets

METHOD FOR NUCLEATION CONTROLLED CHEMICAL VAPOR DEPOSITION OF METAL OXIDE FERROELECTRIC THIN FILMS

FIELD OF THE INVENTION

This invention relates to a method for the chemical vapor deposition of metal oxide thin films. More particularly, the present invention relates to the nucleation controlled chemical vapor deposition of metal oxide ferroelectric thin films.

BACKGROUND OF THE INVENTION

In recent years, there has been a birth of interest in a class of materials commonly referred to as ferroelectric materials which have found wide use in random access memory applications. In such applications, it has been common to employ ferroelectric capacitors which typically evidence high remanent polarization, small size, low leakage current and low fatigue rate. Accordingly, workers in the art have focused their interest upon the development of suitable techniques for the growth of ferroelectric thin films evidencing optimum characteristics for use in such capacitors.

Among the earliest materials investigated for such applications were the perovskite ferroelectrics such as $PbZr_{1-x}Ti_xO_3$, commonly known as PZT. Unfortunately, the techniques employed for the preparation of these materials have resulted in the formation of defects which alter the stoichiometry due to the creation of vacancies. As a result of these difficulties, degradation problems such as fatigue, aging and leakage currents which adversely affect the device lifetime often occur.

More recently, workers in the art focused their interest upon the preparation of $SrBi_2Ta_2O_9$ (SBT) films using metallorganic vapor deposition techniques. Thus, for example, Desu et al. in U.S. Pat. No. 5,527,567 disclosed a method for the deposition by chemical vapor deposition techniques of high quality layered structured oxide ferroelectric thin films. These films were deposited at temperatures ranging from 450–800° C. The patentees specifically noted that at temperatures greater than 650° C. poor quality films were produced whereas at temperatures less than 600° C. excellent quality films were obtained. However, the use of the lower temperatures was found to lower the deposition rate, thereby necessitating a two step deposition with a short term deposition at temperatures ranging from 450–600° C. and a longer term deposition at temperatures ranging from 600–700° C.

Desu et al. further discovered that in the one step deposition procedure using high temperatures, heterogeneous nucleation and grain growth frequently occurred on the polycrystalline material employed as the bottom electrode in the capacitor of interest. The films so produced evidenced a non-uniform crystalline structure having a rough surface morphology. The patentees found, however, that in the two step deposition process, the first step yielded a thin uniform nucleation layer with grain growth occurring at the top of the substrate which provided a homogeneous nucleation and grain growth condition for the second deposition step.

Although this prior art technique and related techniques described by workers in the art have enjoyed a limited level of success, they have not proven satisfactory from the standpoint of replication and the attainment of spatially homogeneous incorporation of all cation species. In fact, there has been growing evidence that repeatable, uniform incorporation of bismuth in the growing SBT film is a challenge. Thus, for example, the following phenomena have been noted in efforts to achieve stoichiometric SBT with a smooth, homogeneous morphology.

It has been observed that bismuth incorporation at low pressures is characterized by a highly non-linear relationship between percentage bismuth in the gas phase (relative to other cation precursors) and percentage bismuth in the deposited film. At low and moderate bismuth percentages in the gas phase (relative to strontium and tantalum) it has been found that the incorporation efficiency of bismuth is very low. In fact, it has been found that in order to attain bismuth percentages in the deposited film ranging from 5–20%, the bismuth percentage in the gas must be greater than 82%. Under those circumstances, it has been observed that large amounts of bismuth evidencing unsatisfactory morphology and the presence of large crystallites separated by bismuth poor regions are present in the deposited film. Intermediate percentages, for example, 40–50%, of bismuth in the deposited film at low pressures evidence poor repeatability and the bismuth incorporation is typically microscopically non-uniform.

At low pressures ranging from 1 to 10 torr, bismuth incorporation is found to increase as a result of longer residence times in the flow system. Thus, for a fixed reactor geometry, residence time is increased by increasing pressure or reducing total flow. If the results are plotted as a function of partial pressure of bismuth, then bismuth efficiencies of differing bismuth percentages in the gas phase mesh satisfactorily. At lower gas flows (500–1000 sccm), the efficiency of bismuth scales well with the partial pressure of bismuth. At higher flow rates (2,000 sccm), the efficiencies of bismuth, strontium and tantalum are all higher.

And lastly, the deposition rate of bismuth is found to be nearly independent of time from 0.5 torr to 8 torr. Early growth stages appear as islands which coalesce at longer times. Additionally, it is noted that the growth rate is significantly higher than those at equivalent partial pressures of bismuth for SBT when strontium and tantalum are present.

Studies have also revealed that when SBT is deposited on bare platinum using triphenyl bismuth as a precursor, it is likely that the bismuth incorporates due to the catalytic effect of the platinum which is dependent on the nature of the platinum surface. Upon formation of a continuous SBT oxide film, the nucleation conditions change and bismuth incorporation would appear to be suppressed except on some bismuth oxide crystallites which also may have some catalytic activity. It is apparent that bismuth nucleates and continues to do so at such sites. If bismuth does not nucleate at that site, it will not nucleate since the strontium tantalate film is able to nucleate and grow and this oxide does not favor subsequent bismuth nucleation. Accordingly, bismuth incorporated in the film is highly dependent upon the formation of these crystallites on the platinum surface. Another explanation for this behavior is the presence of a leaving mechanism for bismuth. Bismuth which cannot be built into the film may leave the film either by migration into the substrate or by evaporation.

In light of the foregoing, it is apparent that the attainment of a uniform, high density of nucleation sites for bismuth or other metals used in such processes is essential to attain deposition of films with controllable composition and uniform morphology.

SUMMARY OF THE INVENTION

In accordance with the present invention, these prior art goals have been effectively attained by means of a novel processing sequence wherein a higher density of nucleation sites is achieved either by (a) the use of a substrate member which has been treated in a manner to yield a controllably and reproducibly rough surface on which ferroeletric films with excellent properties may be produced, (b) by using a chemically modified substrate surface upon which surface chemical properties are modified by the formation of an alloy or (c) by having chamber conditions during the beginning of the deposition which will force the precursor to create a high number of nucleation sites. After formation of these sites, the process will be switched to a growth process. Typical techniques for achieving surface roughening include reactive ion etching, inert ion milling and chemical mechanical polishing, each of which may be used to delineate patterned bottom electrodes. The chemical properties of the substrate may be modified by alloy deposition, deposition of seed layers which are then partially or completely in-diffused, and ion implantation with or without heat treatment. A nucleation step in the beginning of the deposition may be inserted either by having different physical parameters in the CVD chamber such as pressure, temperature, flow rate, deposition rate and the like, or by applying additional or different agents and/or changing the ratio of these agents which may be oxidizing or reducing in nature or having an additional activation in the beginning of the process as for example by a plasma, UV and the like. The resultant oxide ferroelectric thin films are suitable for use in capacitors, memory devices and the like.

In light of the fact that the overcome by the described technique are intrinsic to the deposition of volatile oxides such as $Bi_2O_3$, similar nucleation problems occur during the deposition of other bismuth oxide based ceramics such as ferroelectric $Bi_3Ti_4O_{12}$ or bismuth containing superconductors. Accordingly, the described technique may effectively be used in the deposition of these materials. Additionally, the deposition of lead based materials such as $Pb(Zr,Ti)O3$ will benefit from the described nucleation control procedure due to the presence of volatile PbO which evidences difficulties in nucleation.

BRIEF DESCRIPTION OF THE DRAWING

The invention will be more readily understood by reference to the following detailed description taken in conjunction with the accompanying drawing wherein.

DETAILED DESCRIPTION OF THE INVENTION

The invention relates to the selective deposition of Bi-containing ferroelectric films. Such Bi-containing ferroelectric films are formed by, for example, using β-diketonate Bi precursor. The formation of Bi films with β-diketonate precursor is described in U.S. patent application Ser. No. 08/975,087, titled "Low Temperature Chemical Vapor Deposition Process For Forming Bismuth-Containing Ceramic Thin Film Useful In Ferroelectric Memory Devices", which was filed on Nov. 20, 1997 and in concurrently filed U.S. patent application Ser. No. 08/996,575, titled "METHOD FOR THE SELECTIVE DEPOSITION OF BISMUTH BASED FERROELECTRIC THIN FILMS BY CHEMICAL VAPOR DEPOSITION", both herein incorporated by reference for all purposes.

Figure 1A:
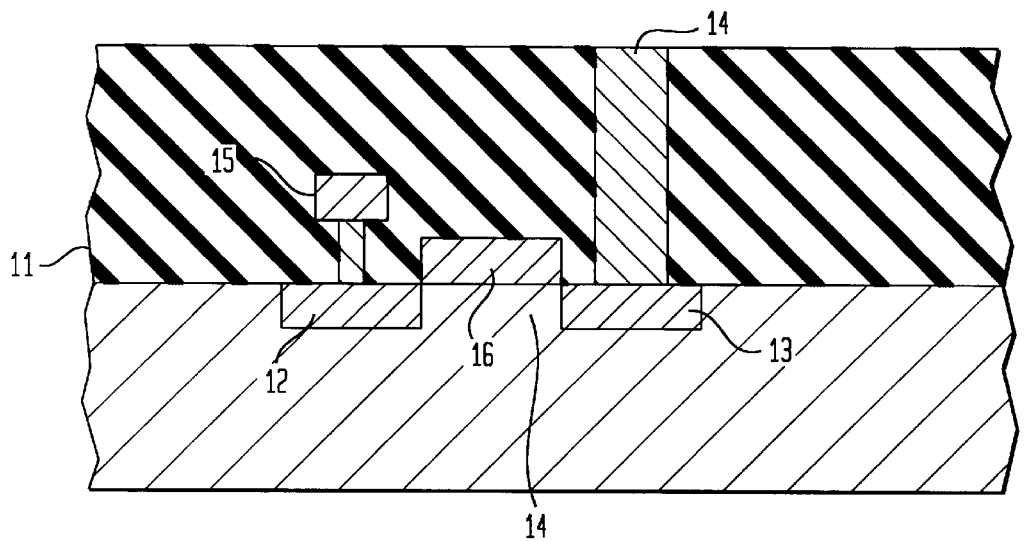
FIG. 1a is a front elevational view in cross-section of a typical FRAM cell including a CMOS transistor without a storage capacitor.

With reference now to FIG. 1a, there is shown a front elevational view in cross-section of a typical ferroelectric random access memory cell (FRAM). Shown in the figure is an insulating substrate 11, typically silicon dioxide ($SiO_2$) or silicon nitride ($Si_3N_4$), on top of a silicon substrate. At the interface between both substrates but embedded into the silicon substrate is a CMOS transistor including source 12, drain 13 and gate 14. Source 12 and gate 14 are connected to bit line 15 and word line 16, respectively. Drain 13 is connected to plug 14 which is designed to serve as connection to a stack capacitor having a bottom electrode, a ferroelectric layer and an upper electrode layer.

Figure 1B:
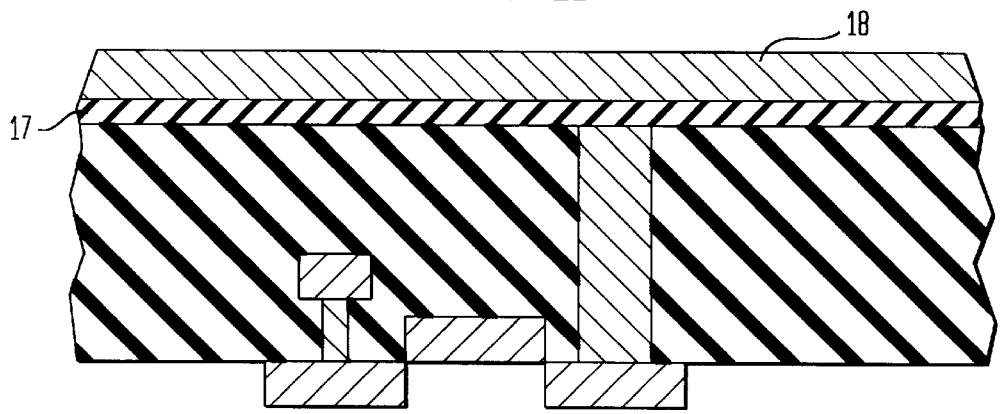
FIG. 1b is a front elevational view in cross section of the structure of FIG. 1a after the deposition thereon of a barrier layer and bottom electrode layer.

The vapor deposition process is normally effected at temperatures ranging from about 300–800° C. in an oxygen containing ambient. Accordingly, in order to obviate oxidation of the plug, typically silicon or tungsten, during the processing, an oxygen barrier layer may be deposited as an intermediate between the bottom electrode of the stack capacitor and the plug 14. FIG. 1b shows the structure of FIG. 1a after the deposition thereon of barrier layer 17. Absent this barrier layer, oxidation may occur which could cause interruption of the electrical connection between the bottom electrode and the drain. Additionally, the barrier layer tends to preclude diffusion of atoms from the electrode or the ferroelectric material into the plug. Also shown in FIG. 1b is bottom electrode 18 of the capacitor, typically comprising a noble metal selected from among platinum, palladium, rhodium, gold and ruthenium, a conductive metal oxide selected from among ruthenium oxide, osmium oxide, rhenium oxide, rhodium oxide, iridium oxide, or mixed metal oxides such as LSCO, YBCO and metal nitrides such as titanium nitride or zirconium nitride.

Figure 1C:
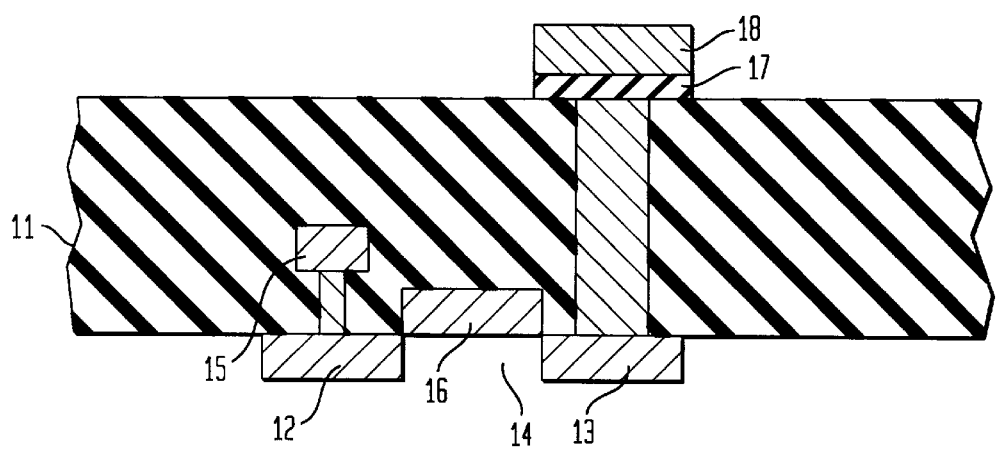
FIG. 1c is a front elevational view in cross section of the structure of FIG. 1b after the patterning of the bottom electrode layer.

The next step in the fabrication of the desired FRAM involves structuring the barrier layer and bottom electrode by conventional photolithographic techniques. The resultant structure is shown in FIG. 1c.

At this juncture deposition of a metal oxide film is effected. This end may be attained in accordance with any of the known techniques for the deposition of metal oxide thin films on the bottom electrode. In order to incorporate a metal, as for example bismuth, reproducibly on the bottom electrode at the proper compositional level with homogeneous morphology and composition, the noble metal bottom electrode is pretreated to effect either roughening or chemical modification.

Roughening the surface of the bottom electrode may be effected, as for example, by reactive ion etching, inert ion milling and chemical mechanical polishing or the use of seed layers, all of which are suitable techniques for delineating patterned bottom electrodes. A typical procedure for attaining this end would involve placing a substrate member bearing the desired noble metal electrode in an $R_f$ sputter tool (13.56 MHz) and evacuating the chamber to attain a pressure of about 5 mtorr. A bias of about 400 V is applied and at about 100 W $R_f$ power an etching rate of the order of 5 nm/minute will be attained to effect etching and roughening. A bottom electrode so treated has a higher density of nucleation sites on the surface so treated which will enhance the incorporation efficiency of the metal deposition.

Another technique for effecting roughening of the noble metal bottom electrode involves the use of a partially reactive adhesion barrier layer, such as titanium, under the noble metal (for example about 2–30 μm of titanium under 100 μm of platinum), by using thicker layers of noble metal, for example about 300 μm and by depositing the noble metal at ambient temperatures, (for example about 25° C.). Other noble metal deposition parameters such as deposition rate, voltage and gas pressure in a sputter deposition process, deposition temperature or deposition ambient will influence the stress and microstructure of the noble metal and make it susceptible in various degrees to roughening either during pre-deposition annealing or in the early stages of SBT deposition.

In pre-deposition annealing, the degree of roughening will be dependent upon various factors such as annealing time, annealing temperature, deposition conditions of the electrode, the metal chosen for the electrode, and the structure of the electrode, for example, platinum/titanium or platinum only. The term pre-annealing as employed herein is intended to define any extended holding time on the substrate heating longer than the time required to heat the substrate to the desired temperature. The term pre-annealing also is intended to encompass those cases wherein additional heating of the substrate is effected after deposition of the bottom electrode but prior to chemical vapor deposition but for the time period required to bring the substrate to the required temperature for chemical vapor deposition.

Alternatively, surface chemical properties of the noble metal may be modified by formation of noble metal alloys using one of several techniques in combination, such as alloy deposition, deposition of seed layers which are then either partially or completely in-diffused or ion implantation which also may be modified by heat treatments. For example, a titanium or bismuth layer may be deposited on the noble metal layer.

A preferred alloy for this purpose comprises 90%, by weight platinum, remainder iridium, a composition which is one of the most chemically resistant alloys. Additionally, the presence of iridium provides thermal stability at high temperatures and decreases oxygen diffusion through the platinum electrode during processing in strongly oxidizing ambients and enhances the reactivity of the precursors at the surface, so resulting in enhanced precursor reactivity at the surface with accompanying enhanced nucleation and incorporation efficiencies.

Chemical pretreatment of the surface has also been found to influence the metal nucleation density. This end may be attained by altering the chemical reactivity of the bismuth precursor on the modified growth surface by means of a chemical pretreatment to enhance the number density of hydroxyl groups or to reduce the presence of hydrophobic species on the surface. It has been determined that surface reactivity may be controlled and optimized for the specific precursor being used. This pre-treatment step and the accompanying surface modification may be implemented with reactive plasmas, ion beams or gas phase chemistry to enhance uniform nucleation and film growth of SBT. The gas phase chemistry alluded to may be implemented by admixing of hydrogen with the oxides before the chemical vapor deposition begins. The reaction of the hydrogen with oxygen will yield water which will or may result in the presence of OH groups on the surface. Alternatively, having an alcohol present in the beginning of the processing sequence will also result in the formation of water or catalytically cleave to generate OH groups. Thus, for example, methyl alcohol and platinum will yield a methyl group and a hydroxyl group on the surface of the platinum.

A still further technique for modifying the noble metal surface is by treatment with chemicals in liquid solutions, as for example, dissolved salts, dissolved complex compounds and organic or inorganic compounds within or without solution. The surface is charged either by roughening with an etching solution ($HCl+HNO_3$) or by cleaning or by depositing metal ions or metal clusters (deposition of noble metals from solution), or by changing the type of adsorbed molecules in order to create more nucleation sites.

A uniform high density of nucleation sites for metals may also be attained by modifying the deposition conditions during nucleation in the beginning of the CVD process. These parameters include deposition rate, pressure, gas flow, gas composition, temperature and the oxidizing-reducing environment during nucleation of the SBT films by altering the amount of oxidizers present or the amount of reducing agents present. Typical oxidizers employed for this purpose are $O_2$, $N_2O$, $O_3$, $H_2O_2$, $NO_2$ etc. $H_2$, $NH_3$, and CO are typical reducing agents for this purpose. This two stage process involving nucleation and then growth is also found to be successful in obtaining a high number of nucleation sites. Finally, the presence of plasmas either at the deposition surface or remote from the surface may be used to control this parameter because a plasma will force the precursor combustion, thereby creating nuclei.

The bottom electrode so treated has a large number of nucleation sites which will enhance the nucleation of metal oxides during the deposition.

The base substrate offers a small number of absorption sites and is not catalytically active under the chemical vapor deposition conditions. Typical materials found useful for this purpose are silicon dioxide, silicon nitride and certain metal oxides which are non-conducting oxides such as tantalum pentoxide and strontium titanium oxide ($SrTiO_3$).

Deposition of the desired materials may be effected in a conventional chemical vapor deposition apparatus, as for example, a warm wall reactor. The substrates are placed in the reaction chamber which is then sealed and the system evacuated to a pressure ranging from 0.1 to 10 torr. The substrate member is then heated to a temperature ranging from about 400–700° C. with a gas flow ranging from about 500–10000 sccm. Chemical precursors which are suitable for the chemical vapor deposition of $SrBi_2Ta_2O_9$ are bismuth triphenyl $Bi(Ph)_3$, $Sr(thd)_2$-tetraglyme and $Ta(O-i-Pr)_4(thd)$ dissolved in tetrahydrofuran, isopropyl alcohol and tetragylme (THF:IPA:tetraglyme). A suitable volume ratio for the solvent components in the THF:IPA:tetraglyme solvent composition may be an 8:2:1 volume ratio. Precursor solutions are mixed prior to deposition and flash evaporated upon a matrix. Typical vaporizer temperatures range from about 200–250° C. A preferred temperature for this step is about 210° C. The precursor vapor is then transported at a flow rate ranging from about 50–600 sccm and preferably within the range of about 200 to 400 sccm by a suitable carrier gas, such as argon, to the reaction chamber. The liquid delivery rate should range from about 0.05 to 1 ml per minute with a preferred range of about 0.07 to 0.25 ml per minute. At the inlet of the chamber, it is mixed further with argon and oxygen. Coating of the substrate is then effected.

Figure 1D:
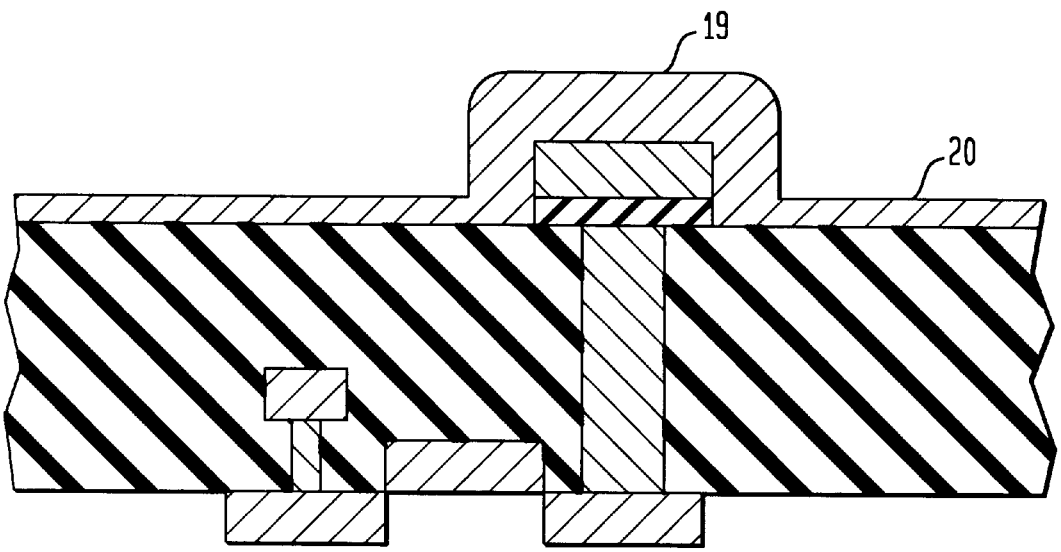
FIG. 1d is a front elevational view in cross section of the structure of FIG. 1c after the chemical vapor deposition of a $SrBi_2Ta_2O_9$ (SBT) layer and a strontium tantalate layer.

Shown in FIG. 1d is the structure of FIG. 1c after the chemical vapor deposition of a metal oxide ferroelectric (SBT) electrode layer 19 and a strontium tantalate layer 20 on top of the surrounding insulating material which is silicon dioxide or silicon nitride.

Figure 1E:
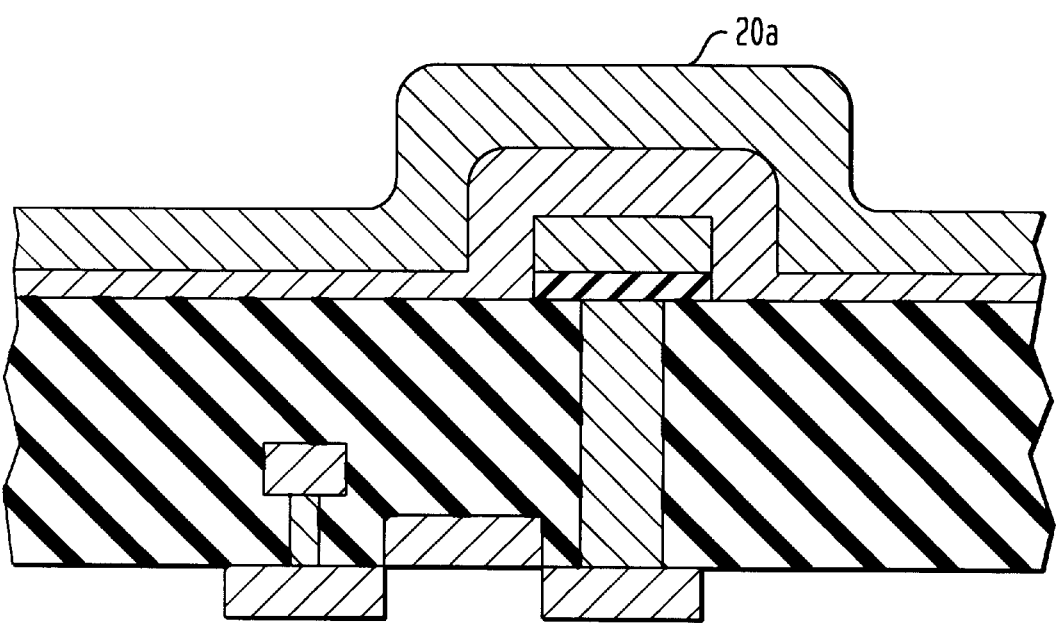
FIG. 1e is a front elevational view in cross section of the structure of FIG. 1d after the deposition thereon of a top electrode.

Following, the resultant structure is subjected to a high temperature anneal in the presence of oxygen to transform the as-deposited phase to the ferroelectric Aurivillius phase. Typically, the temperature of the anneal is about 600–820° C., preferably about 750–800° C. Then, a top electrode 20a, typically a noble metal electrode, is deposited upon the structure shown in FIG. 1d to yield the structure shown in FIG. 1e. At that juncture, a further high temperature anneal is effected in the presence of oxygen at a temperature that may be different from or the same as the temperature of the first anneal step. This top electrode will then serve as the common plate for all capacitors.

An example of the practice of the present invention is set forth below. It will be understood by those skilled in the art that this example is for purposes of exposition only and is not to be construed as limiting.

EXAMPLE

Two different substrates were coated with SBT films under the same deposition conditions. The substrates were chemically equivalent and included a 100 nm thickness of platinum on silicon dioxide on silicon. The precursors employed were Sr(thd)$_2$ (tetraglyme), Ta(thd) (OiPr)$_4$, and BiPh$_3$ (thd=2,2,6,6-tetramethylheptane-3,5-dionate, OiPr= isopropoxide, and Ph=phenyl). The solvent employed was tetrahydrofurane/isopropanol/tetraglyme in a volume ratio of 8:2:1. The concentrations of the precursors in this solvent system were: 0.15 M Sr source, 0.4 M Ta source and 0.4 M Bi source. Each of the precursor solutions was stored separately and mixed prior to deposition. Following, the mixture of precursors was flash evaporated upon a matrix at a vaporization temperature of about 205° C. with a liquid delivery rate ranging from about 0.05 to 0.2 ml/min. The vaporized precursors were then transported by an argon carrier gas to the reaction chamber. At the inlet of the chamber, the precursor stream was mixed further with argon and oxygen. The CVD reactor was a warm walled reactor ($T_{wall}$ is about 200° C.) comprising a quartz tube having a diameter of 12.5 cm.

Although both substrates were chemically equivalent, substrate 1 roughened significantly more than substrate 2 in the time before deposition while the wafer heated up in an oxygen ambient. The root mean squared (RMS) roughness of each substrate after about 5 minutes in an oxygen ambient at about 620° C. was about 11.1 nm for substrate 1 and about 1.7 nm for substrate 2 as measured by atomic force microscopy. Deposition conditions for both SBT films were about:

1 torr total pressure

620° C. substrate temperature 900 sccm total gas flow

50% O2 precursor ratios: 10.5% Sr, 81.6% Bi, 7.9% Ta 30 minutes deposition time

The substrate in each case was arranged perpendicular to the gas flow. Following the deposition of the film, the precursor delivery was stopped and the resultant structure permitted to cool in the argon/oxygen stream. The resulting films evidenced composition and thickness as set forth in Table I, below:

TABLE I

|  | Initial Roughness (RMS) | SrO dep rate A/min | Bi2O3 dep rate A/min | Ta2O5 Dep rate A/min | thickness |
| --- | --- | --- | --- | --- | --- |
| Sub 1 | 11.1 nm | 12.6 | 18.4 | 22.1 | 159 nm |
| Sub 2 | 1.7 nm | 12.1 | 1.6 | 20.6 | 103 nm |

For these conditions, an increase in the roughness increased the rate of bismuth deposition by a factor of 10. Surface roughness had little effect on strontium and tantalum deposition rates.

The method of the present invention may be employed to deposit Bi$_2$O$_3$ only in those areas in which it is needed to form a ferroelectric SBT phase, for example, on top of a bottom electrode with a high degree of reproducibility at the appropriate composition and a homogeneous morphology. The method of the invention is usefully carried out so that the insulating material that surrounds the bottom electrode is not covered with Bi$_2$O$_3$ but instead is covered only with SrO and Ta$_2$O$_5$. The significance of this finding is as follows: First, Bi$_2$O$_3$ is known to react with SiO$_2$ to form bismuth silicates. Thus, if TEOS—SiO$_2$ is present beside the bottom electrode it would be transformed into a silicate. This would affect the stress in the entire wafer and increase the likelihood of the silicate density being different from that of TEOS—SiO$_2$. Additionally, such a change in density might be accompanied by void formation.

Further, when strontium tantalate is deposited on a silicon dioxide or silicon nitride surface, an etching step to remove it becomes necessary because strontium tantalate is an inactive material. However, with SBT covering the entire substrate, an etching step to remove the SBT from other places than the bottom electrode is likely to be required because of the high mobility of the bismuth.

It will be appreciated by those skilled in the art that removal of unwanted dielectric film over the isolation dielectric is more economical because there is less material in those locations, and alternatively, it can be left there because the physical and chemical integrity of the dielectric layer there, namely strontium and tantalum oxides, is superior to the situation existing where the bismuth-containing SBT layer is present over the silicon oxide or nitride.

What is claimed is:

1. A method for the nucleation controlled deposition of thin films suitable for use as the dielectric of a capacitor on a substrate member by metal-organic chemical vapor deposition which comprises the steps of:

(a) placing the substrate member in a chemical vapor deposition apparatus, the substrate having deposited upon a portion thereof a film of an electrically conductive material;

(b) heating the substrate to an elevated temperature in the range of from about 300° C. to 800° C. within the apparatus;

(c) introducing vaporized metal-organic precursors carried by an inert gas into the apparatus, and thermally decomposing the precursors to substantially simultaneously yield a first thin film of a homogenous composition upon the electrically conductive material, and a second thin film of a composition different from the first thin film upon the exposed substrate surface.

2. The method in accordance with claim 1 wherein the first thin film is a dielectric material.

3. The method in accordance with claim 2 wherein the dielectric material is a ferroelectric material or a material capable of being transformed into a ferroelectric material.

4. The method in accordance with claim 3 wherein the ferroelectric material is a ceramic material with a perovskite structure.

5. The method in accordance with claim 4 wherein the ferroelectric material has an Aurivillius structure.

6. The method in accordance with claim 5 wherein the ferroelectric material is $SrBi_2Ta_2O_9$ or a derivative thereof.

7. The method in accordance with claim 5 wherein the ferroelectric material is $Bi_4Ti_3O_{12}$ or a derivative thereof.

8. The method in accordance with claim 2 wherein the dielectric is a perovskite material.

9. The method in accordance with claim 1 wherein the first thin film is capable of being transformed into a ferroelectric film by annealing at a temperature with in the range of 600–800° C.

10. The method in accordance with claim 1 wherein the electrically conductive material is selected from the group consisting of noble metals, metal oxides and metal nitrides.

11. The method in accordance with claim 1 wherein the electrically conductive material has been roughened by reactive ion etching.

12. The method in accordance with claim 1 wherein the surface properties of the electrically conductive material have been altered by changing its surface chemistry.

13. The method in accordance with claim 1 wherein the chemical nature of the substrate has been altered prior to chemical vapor deposition by exposing the substrate to chemical agents.

14. The method in accordance with claim 13 wherein the chemical agents are gaseous.

15. The method in accordance with claim 13 wherein the chemical agents are liquids.

16. The method in accordance with claim 13 wherein the substrate in the chamber is exposed to the chemical agents before chemical vapor deposition.

17. The method in accordance with claim 13 wherein the chemical agents are selected from the group consisting of alcohols, alkanes, alkenes, aromatics, amines and strong oxidizing agents.

18. The method in accordance with claim 1 wherein the electrically conductive material has been roughened to an initial surface roughness greater than 6 nm.

19. The method in accordance with claim 1 wherein the electrically conductive material has been roughened by inert ion mulling.

20. The method in accordance with claim 1 wherein the electrically conductive material has been roughened by chemical mechanical polishing.

21. The method in accordance with claim 1 wherein the electrically conductive material has been roughened by chemical etching.

22. The method in accordance with claim 1 wherein the electrically conductive material has been roughened by chemicals in solutions.

23. The method in accordance with claim 12 wherein the surface chemistry has been changed by depositing a second material upon the electrically conductive material.

24. The method in accordance with claim 23 wherein the second material is selected from the group consisting of iridium, titanium, tantalum, strontium or bismuth.

25. The method in accordance with claim 23 wherein the second material is deposited by sputtering.

26. The method in accordance with claim 10 wherein the electrically conductive material is platinum.

27. The method in accordance with claim 10 wherein the electrically conductive material is an alloy comprising 90% by weight platinum and 10% by weight iridium.

28. The method in accordance with claim 1 wherein the metal-organic precursor is selected from the group consisting of triphenyl bismuth, tritolyl bismuth, bismuth alkyl, bismuth alkoxides, bismuth β-diketonates, bismuth amides, mixed ligand bismuth compound and mixtures thereof.

29. The method in accordance with claim 1 wherein the precursors comprise a mixture of Strontium 2,2,6,6-tetramethylheptane-3,5-dionate as tetraglyme adduct, triphenyl bismuth and tantalum 2,2,6,6-tetramethylheptane-3,5-dionate tetrakis (isopropoxide).

30. The method in accordance with claim 1 wherein the first thin film is $SrBi_2Ta_2O_9$ and the first thin film is subjected to a high temperature anneal in the presence of oxygen at a temperature ranging from 600–820° C.

31. The method in accordance with claim 1 wherein the electrically conductive material has been roughened prior to chemical vapor deposition.

32. The method in accordance with claim 10 wherein the noble metal is chemically modified by the use of seed layers.

33. The method in accordance with claim 1 wherein the substrate is pre-annealed prior to deposition in order to roughen it.

34. The method in accordance with claim 33 wherein pre-annealing is effected in situ in the chemical vapor deposition apparatus.

35. The method in accordance with claim 33 wherein pre-annealing is effected at a temperature employed in the chemical vapor deposition apparatus.

36. The method in accordance with claim 1 wherein the metal-organic precursor comprises bismuth.

37. The method in accordance with claim 1 wherein the electrically conductive material has been pretreated by one of the techniques selected from the group consisting of:

reactive ion etching;

inert ion milling;

chemical mechanical polishing;

use of seed layers;

partially reactive adhesion barrier layer;

formation of noble metal alloys;

chemical pretreatment;

treatment with chemicals in liquid solutions and varying deposition conditions.

38. A method for the nucleation controlled deposition of thin films suitable for use as the dielectric of a capacitor on a substrate member by metal-organic chemical vapor deposition which comprises the steps of:

(a) placing the substrate member in a chemical vapor deposition apparatus, the substrate having deposited upon a portion thereof a film of an electrically conductive material, wherein the electrically conductive material has been pretreated;

(b) heating the substrate to an elevated temperature in the range of from about 300° C. to 800° C. within the apparatus;

(c) introducing vaporized metal-organic precursors carried by an inert gas into the apparatus, and thermally decomposing the precursors to substantially simultaneously yield a first in film of a homogenous composition upon the electrically conductive material, and a second thin film of a composition different from the first thin film upon the exposed substrate surface.

39. A method for the nucleation controlled deposition of thin films suitable for use as the dielectric of a capacitor on a substrate member by metal-organic chemical vapor deposition which comprises the steps of:

(a) placing the substrate member in a chemical vapor deposition apparatus, the substrate having deposited upon a portion thereof a film of an electrically conductive material;

(b) heating the substrate to an elevated temperature in the range of from about 300° C. to 800° C. within the apparatus;

(c) introducing vaporized metal-organic precursors carried by an inert gas into the apparatus, and thermally decomposing the precursors to substantially simultaneously yield a first thin film of a homogeous morphology and composition upon the electrically conductive material, and a second thin film of a composition different from the first thin film upon the exposed substrate surface.

40. The method in accordance with claim 39 wherein the electrically conductive material has been roughened by the use of a plasma at the inception of the CVD process.

41. The method in accordance with 39 wherein the electrically conductive material has been roughened by the use of ultraviolet activation at the inception of the CVD process.

42. The method in accordance with claim 39 wherein the electrically conductive material has been roughened by the use of strong oxidizing agents at the inception of the CVD process.

43. The method in accordance with claim 39 wherein the electrically conductive material has been roughened by the use of reducing agents at the inception of the CVD process.

44. The method in accordance with claim 40 wherein the oxidizing agents are selected from the group consisting of NO, $NO_2$, $H_2O_2$, and $O_3$.

45. The method in accordance with claim 43 wherein the reducing agents are selected from the group consisting of $H_2$, $NH_3$, $N_2H_4$ and alcohols.

* * * * *